United States Patent [19]

Shimizu et al.

[11] Patent Number: 4,833,507

[45] Date of Patent: May 23, 1989

[54] ELECTRON EMISSION DEVICE

[75] Inventors: Akira Shimizu, Inagi; Takeo Tsukamoto, Atsugi; Akira Suzuki; Masao Sugata, both of Yokohama; Isamu Shimoda, Zama; Masahiko Okunuki, Tokyo, all of Japan

[73] Assignee: Canon Kabushiki Kaisha, Tokyo, Japan

[21] Appl. No.: 179,863

[22] Filed: Apr. 11, 1988

[30] Foreign Application Priority Data

Apr. 14, 1987 [JP] Japan .................................. 62-89812

[51] Int. Cl.$^4$ .............................................. H01L 29/34

[52] U.S. Cl. .......................................... 357/4; 357/52

[58] Field of Search ............................ 357/45 L, 4, 52

[56] References Cited

U.S. PATENT DOCUMENTS 4,163,237 7/1979 Dingle .................................... 357/4

OTHER PUBLICATIONS

Zipperian, IEDM 1983, pp. 696–699.

*Primary Examiner*—Martin H. Edlow

*Attorney, Agent, or Firm*—Fitzpatrick, Cella, Harper & Scinto

[57] ABSTRACT

An electron emission device comprises a P-type semiconductor layer which emits electron injected into the P-type semiconductor layer by utilizing the negative electron affinity state. At least one of said N-type semiconductor layer and the P-type semiconductor layer is made to have a super-lattice structure.

2 Claims, 2 Drawing Sheets

ELECTRON EMISSION DEVICE

BACKGROUND OF THE INVENTION

1. Field of the Invention

This invention relates to an electron emission device, particularly to one comprising a P-type semiconductor layer formed on a N-type semiconductor layer which emitts electrons injected into said P-type semiconductor layer by utilizing the negative electron affinity state.

2. Related Background Art

Among the electron emission devices of the prior art, there is the system in which a work function lowering material layer is formed on a P-type semiconductor layer and electrons are emitted by utilizing the NEA (negative electron affinity) at which the vacuum level is at an energy level lower than the conduction band of the P-type semiconductor.

FIG. 1(A) is a schematic illustration of the electron emission device by use of the NEA state, and FIG. 1(B) a graph showing its schematic current-voltage characteristic.

In the same Figure (A), when a forward bias voltage is applied to the PN junction, the current I flows in the forward direction as shown in the same Figure (B), and a part of the electrons injected from the N layer 8 into the P layer 9 are emitted from the surface of the P layer 9 into vacuum.

On the surface of the P layer 9, a work function lowering material 10 such as of an alkali metal (e.g. Cs), etc. is formed for imparting the NEA state as described above, and the electrons injected into the P layer 9 can be readily emitted, to provide an electron emission device having high electron emission efficiency.

However, in the electron emission device of the prior art as described above, the electron emission efficiency was not sufficient, and it has been desired to have an electron emission device having higher efficiency.

SUMMARY OF THE INVENTION

An object of the present invention is to provide an electron emission device with more improved electron emission efficiency.

For this purpose, according to a first embodiment, in an electron emission device comprising a P-type semiconductor layer formed on a N-type semiconductor layer which emits electrons injected into said P-type semiconductor layer by utilizing the negative electron affinity state, at least one of said N-type semiconductor layer and said P-type semiconductor layer is made to have a super-lattice structure.

On the other hand, according to a second embodiment, in an electron emission device comprising a P-type semiconductor layer formed on a N-type semiconductor layer which emits electrons injected into said P-type semiconductor layer by utilizing the negative electron affinity state, at least said N-type semiconductor layer is made to have a super-lattice structure and at least a part thereof is formed by selective doping.

The first embodiment make either one or both of the N-type semiconductor layer and the P-type semiconductor layer super-lattice structure to improve perfection of crystal structure through amelioration of flatness of the semiconductor layer, amount of defects, etc., and also enables narrowing of the energy distribution of the electrons emitted by narrowing the width of the electron energy distribution utilizing the state density of electrons which becomes stepwise configuration through the quantum effect.

The second embodiment makes at least the N-type semiconductor layer super-lattice structure and forms at least a part thereof by selective doping (or called modulated doping), thereby increasing mobility in addition to the actions of the above first embodiment and also reduces Deep impurity level which is called the DX center to make the electron density greater and also prevent the running electrons from being captured at said DX center, thus improving electron emitting efficiency.

DETAILED DESCRIPTION OF THE PREFERRED EMBODIMENTS

Referring now the drawings, the electron emission device of the present invention is described in detail.

Figure 1A:
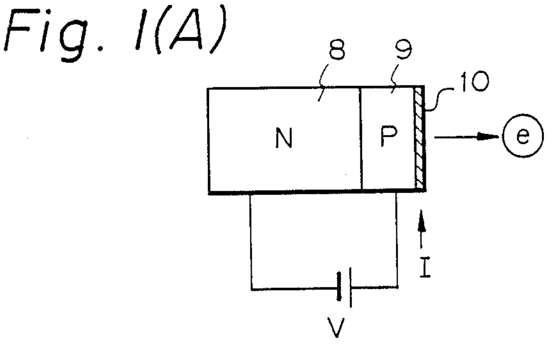
FIG. 1(A) is a schematic illustration of the electron emitting device by use of the NEA state.
Figure 1B:
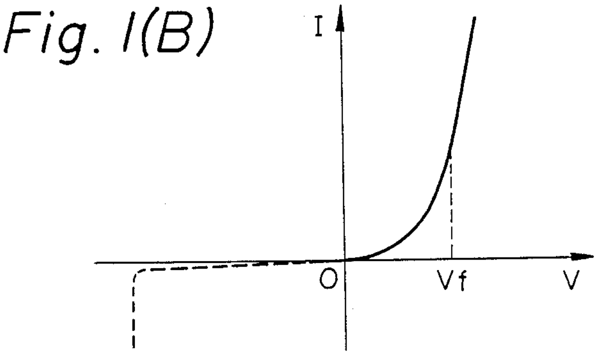
FIG. 1(B) is a graph showing its schematic current-voltage characteristic.
Figure 2:
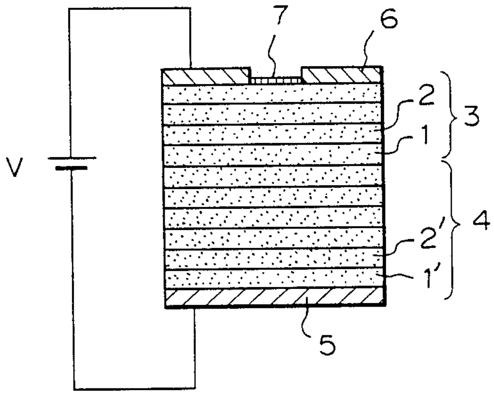
FIG. 2 is a schematic sectional view of an example of the electron emission device according to the first embodiment of the present invention.

FIG. 2 is a schematic sectional view showing an example of the first embodiment of the electron emission device.

As shown in the same Figure, on a N-type semiconductor layer 4 is formed a P-type semiconductor layer 3, and on the P-type semiconductor layer 3 is formed an electrode 6 through the ohmic contact layer. The electrode 6 is provided with an electron emission opening and a work function lowering material layer 7 such as of Cs, etc. is formed at this portion. The work function lowering material layer 7 is under the NEA state as described above, thus forming an electron emission portion. On the other surface of the N-type semiconductor layer 4, an electrode 5 is formed through the ohmic contact layer.

In the electron emission device having such structure, when a voltage V is applied between the electrodes 5 and 6 with the electrode 6 being at higher potential, the PN junction portion is biased in forward direction, whereby electrons are injected from the N-type semiconductor layer 4 into the P-type semiconductor layer 3, and a part of the electrons are emitted from the work junction lowering material layer 7.

The first embodiment makes the P-type semiconductor layer 3 and the N-type semiconductor layer 4 super-lattice structures and, as shown in the Figure, they are formed by laminating the first semiconductor layers 1, 1′ and the second semiconductor layers 2, 2′ alternately using MBE (molecular beam epitaxy), etc. The first semiconductor layers 1, 1′ and the second semiconductor layers 2, 2′ may be made of the same material, respectively. As the combination of the first semiconductor layers 1, 1′ and the second semiconductor layers 2, 2′, there are combinations of, for example, GaAs and AlAs, ZnS and ZnTe, etc. As the P-type impurity, Ge, Zn, Be, etc. may be employed, and as the N-type impurity, Si, Sn, Se, Te, etc. may be employed. They can be doped by carrying out growth of crystals while effecting doping, or effecting ion implantation.

By making thus the P-type semiconductor layer 3 and the N-type semiconductor layer 4 super-lattice structures, crystals of relatively good quality can be obtained. For example, when $Al_xGa_{1-x}As$ is used as the semiconductor layer, if crystals with large x are grown by MBE, etc., the quality of crystals is known to be not good due to unevenness, oxidation, etc. of the growth surface. However, by forming a super-lattice structure of $Al_xGa_{1-x}As/GaAs$, the growth surface can be flattened at the layer of GaAs or made resistible to oxidation, whereby scattering or trapping of electrons caused by poor quality of crystals can be prevented to improve electron emission efficiency.

In addition to the above effect, by making the P-type semiconductor layer 3 and the N-type semiconductor layer 4 super-lattice structures, the width of the electrons emitted can be narrowed to effect conversion of the electron beams at high precision.

These effects are described in detail below.

Figure 3A:
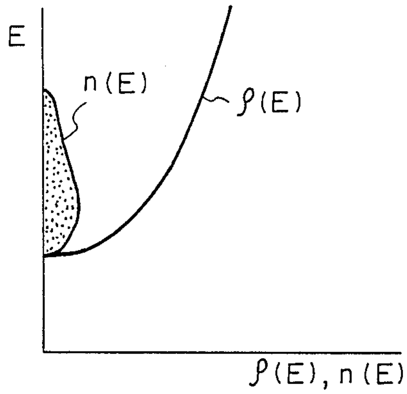
FIG. 3(A) is a graph for illustration of the characteristics of the bulk crystalline semiconductor of the prior art.
Figure 3B:
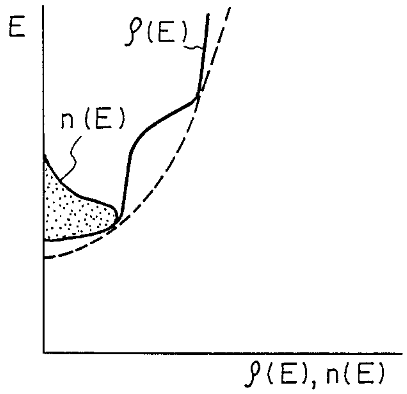
FIG. 3(B) is a graph for illustration of the characteristics of the super-lattice structure.

FIG. 3(A) is a graph for illustrating the characteristics of the bulk crystalline semiconductor of the prior art, and FIG. 3(B) is a graph for illustrating the characteristics of the super-lattice structure.

As shown in FIG. 3(A), in the bulk crystalline semiconductor of the prior art, the state density function (E) becomes parabolic, whereby the width of the electron energy distribution n(E) becomes broader. On the other hand, as shown in FIG. 2(B), in the super-lattice structure, the state density function (E) becomes approximately stepwise configuration, whereby the width of electron energy distribution n(E) becomes narrow. For this reason, the energy distribution of the electrons emitted becomes narrow to make the variance of electrons in the progress direction by electrical field control smaller, whereby it becomes possible to converge the diameter of the electron beam smaller.

In the above example, similar effect may appear even when either one of the P-type semiconductor layer 3 and the N-type semiconductor layer 4 may be made super-lattice structure, but its effect can appear more markedly by making the both super-lattice structures.

Next, the electron emission device according to the second embodiment is to be described.

Figure 4:
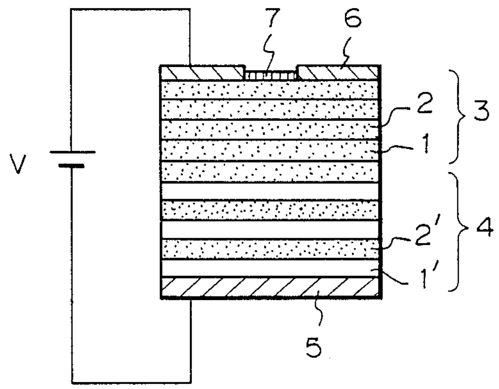
FIG. 4 is a schematic sectional view of the electron emission device according to the second embodiment of the present invention.

FIG. 4 is a schematic sectional view of the electron emission device according to the second embodiment.

The same members as shown in FIG. 2 are attached with the same numerals.

As shown in the same Figure, the first semiconductor layer 1' and the second semiconductor layer 2' are laminated with only the semiconductor layer 2' being doped with N-type impurity such as Si, Sn, Se, Te, etc. to form a N-type semiconductor 4. Such way of doping is called selective doping, but in this case all of the layers are not necessarily required to be applied with selective doping. Further, on the N-type semiconductor layer 4, the first semiconductor layer 1 and the second semiconductor layer 2 are laminated to form a P-type semiconductor layer 3. As the P-type impurity, Ge, Zn, Be, etc. may be employed, and doping may be effected by growing crystals while effecting doping or by performing ion implantation.

In the second embodiment, by forming at least a part of the N-type semiconductor layer 4 by effecting selective doping in addition to the super-lattice structure according to the first embodiment, (1) Deep impurity level called as DX center can be reduced to increase the electron density, (2) also the electrons running through the N-type semiconductor layer 4 will not be captured at the DX center, whereby electrons can be injected into the P-type semiconductor layer 3 with good efficiency, and (3) further, mobility can be generally made greater by selective doping. As the result of the effects as mentioned in (1), (2) and (3), electron emitting efficiency can be improved.

By making the P-type semiconductor layer 3 super-lattice structure as described above, the electron emission efficiency as shown in the first embodiment can be more improved, and also if the P-type semiconductor layer 3 is formed by use of selective doping similarly as the above N-type semiconductor layer, the electron emission efficiency can be improved through improvement of mobility, etc.

As described in detail above, according to the first embodiment, perfection of crystal-structure can be improved to increase the electron efficiency. Also, the energy distribution of the electrons can be made narrower, resulting in conversion of electron beam at high precision.

According to the second embodiment, the electron density in the semiconductor layer can be made greater to reduce the proportion of the running electrons captured at the DX center, and also mobility can be improved, whereby the electron emission efficiency can be more improved.

We claim:

1. An electron emission device comprising a P-type semiconductor layer formed on a N-type semiconductor layer which emits electrons injected into said P-type semiconductor layer by utilizing the negative electron affinity state, characterized in that at least one of said N-type semiconductor layer and said P-type semiconductor layer is made to have a super-lattice structure.

2. An electron emission device according to claim 1, wherein at least said N-type semiconductor is made to have a super-lattice structure and at least a part thereof is formed by selective doping.

* * * * *

UNITED STATES PATENT AND TRADEMARK OFFICE
CERTIFICATE OF CORRECTION

PATENT NO. : 4,833,507

DATED : May 23, 1989

INVENTOR(S) : AKIRA SHIMIZU, ET AL.

It is certified that error appears in the above-identified patent and that said Letters Patent is hereby corrected as shown below:

IN [57] ABSTRACT

Line 2 "electron" should read --electrons--.

COLUMN 1

Line 8, "a" should read --an--.
Line 9, "emitts" should read --emits--.
Line 47, "a" should read --an--.
Line 55, "a" should read --an--.
Line 61, "make" should read --makes--.

COLUMN 2

Line 31, "now" should read --now to--.
Line 36, "a" should read --an--.

COLUMN 3

Line 31, "FIG. 2(B)," should read --FIG. 3(B),--.
Line 55, "a" should read --an--.

UNITED STATES PATENT AND TRADEMARK OFFICE

CERTIFICATE OF CORRECTION

PATENT NO. : 4,833,507

DATED : May 23, 1989

INVENTOR(S) : AKIRA SHIMIZU, ET AL. Page 2 of 2

It is certified that error appears in the above-identified patent and that said Letters Patent is hereby corrected as shown below:

COLUMN 4

Line 45, "a" should read --an--.
Line 53, "N-type semiconductor" should read --N-type semiconductor layer--.

Signed and Sealed this

Twenty-seventh Day of March, 1990

Attest:

JEFFREY M. SAMUELS

*Attesting Officer*

*Acting Commissioner of Patents and Trademarks*